United States Patent [19]

Nakamura et al.

[11] Patent Number: 4,853,271

[45] Date of Patent: Aug. 1, 1989

[54] CERAMIC SUBSTRATE FOR SEMICONDUCTOR PACKAGE

[75] Inventors: Katsumi Nakamura, Youkaichi; Tadahisa Yamamoto, Shiga, both of Japan

[73] Assignee: Kyocera Corporation, Kyoto, Japan

[21] Appl. No.: 145,466

[22] Filed: Jan. 19, 1988

[30] Foreign Application Priority Data

Mar. 31, 1987 [JP] Japan .............................. 62-49467[U]

[51] Int. Cl.$^4$ ............................................... B32B 3/02
[52] U.S. Cl. ...................................... 428/81; 428/192
[58] Field of Search .................. 428/81, 192; 206/329, 206/332, 328; 437/925, 947

[56] References Cited

U.S. PATENT DOCUMENTS

| | | | |
|---|---|---|---|
| 4,277,528 | 7/1981 | Doi et al. ............................. | 428/81 X |
| 4,456,641 | 6/1984 | Ohtani ................................ | 428/81 X |

Primary Examiner—Alexander S. Thomas
Attorney, Agent, or Firm—Spensley Horn Jubas & Lubitz

[57] ABSTRACT

A ceramic substrate for use in packaging semiconductors is provided. The substrate is nearly rectangular. The end portion of at least one short side of the substrate comprises two outwardly projecting arcuate convex portions with a radius of curvature of Rs, an arcuate inwardly depressed concave portion with a radius of curvature of $R_B$ formed between said convex portions to define a nearly central part of said short side, corner portions with a radius of curvature of Rc each connecting the outside end portion of each arcuate convex portion to each long side of the substrate, and curvature connecting portions with a radius of curvature of Rt each connecting the inside end portion of each arcuate convex portion to each end portion of the arcuate concave portion. A pair of most projecting portions are located in the curvature connecting portions and spaced from each other by a distance corresponding to about one-half of the width of the ceramic substrate. The radii of curvatures of the individual portions are as follows:

Rs=20–110 mm,
$R_b$=60–350 mm,
Rc=0.1 mm or more, and
Rt=7–20 mm.

4 Claims, 4 Drawing Sheets

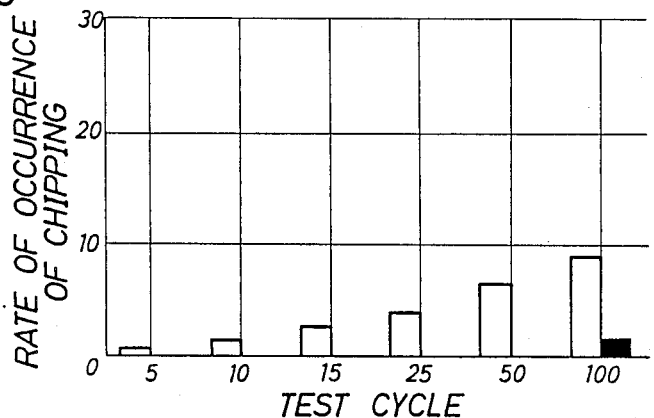
Fig. 4-A
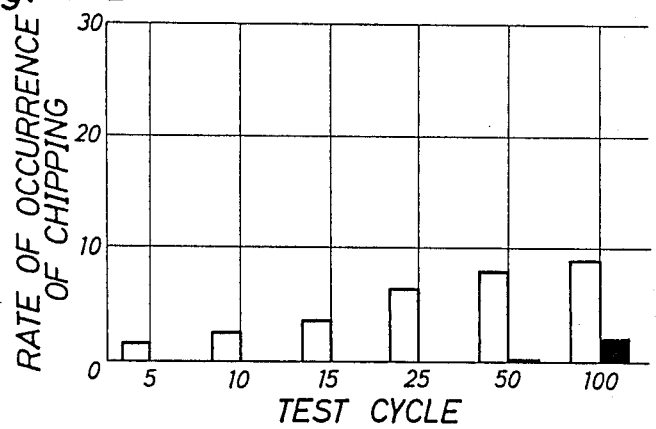
Fig. 4-B
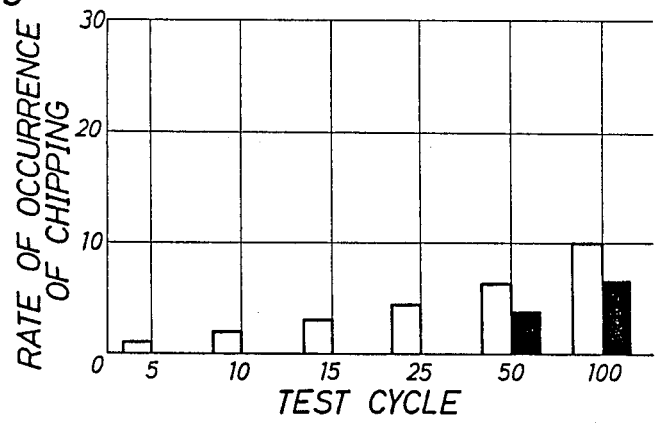
Fig. 4-C

CERAMIC SUBSTRATE FOR SEMICONDUCTOR PACKAGE

BACKGROUND OF THE INVENTION

1. Field of the Invention

This invention relates to an improvement in a ceramic substrate for use in a semiconductor package for storing semiconductor elements, and more specifically, to a ceramic substrate in which chipping of its end portions due to collision with another substrate is prevented during transfer and conveyance of the substrate or the semiconductor package.

2. Description of the Prior Art

Conventional ceramic substrates used for semiconductor packages are provided with various measures taken to prevent chipping upon their collision with each other.

For example, Japanese Laid-Open Utility Model Publication No. 49444/1983 discloses a ceramic substrate having a planar portion with a size A of 2 to 8 mm located centrally at the end surface of a short side of the substrate, taper surfaces each having a size C of 0.1 to 0.5 mm smaller than size B extending from both side lines of the planar portion toward both side ends, and an arc R having a size D of 0.3 to 1.5 mm at a cross position between the end surface of a long side of the substrate and the taper surface, as shown in FIG. 5. When such conventional ceramic substrates are transferred in a container having a large clearance, or moved through a transfer passage having a large clearance, the ceramic substrates rock. As a result, the arcuate portion R frequently collides with other ceramic substrates and undergo chipping. A notch N for clearly showing the position of taking out lead terminals from semiconductor elements stored in the substrates is usually provided in the planar portion formed approximately at the center of the end surface of the short side, and minute wavings occur in the neighborhood of the notch N as a natural consequence of substrate production. Hence, in the event of collision between ceramic substrates, the stresses of collision are concentrated on the neighborhood of the notch portion N and may result in chipping of the notch portion N.

Japanese Laid-Open Patent Publication No. 119748/1984 discloses as shown in FIG. 6 that a plurality of wavy portions Y having nearly the same wave height are formed on the end surface of a short side of a ceramic substrate used for a semiconductor package. However, in relation to the fact that in the ceramic substrate, wavy convex portions Y and concave portions Z are formed with nearly the same amplitude (wave height) with respect to the center line Z, this ceramic substrate has the following defects. Specifically, in a production line for semiconductor packages or semiconductor devices, discrimination of the directions of ceramic substrates or packages using them or the regulation of their positions are effected at the central part of the short side of the substrates. Since the increasing of the amplitude exceeds the allowable limit of the direction discrimination or position regulation, the wave height of the wavy portions Y has to be maintained small. Accordingly, in the transfer of ceramic substrates in which rocking is liable to occur, the corner portions may also collide to undergo chipping.

SUMMARY OF THE INVENTION

It is an object of this invention therefore to provide a ceramic substrate having such a shape that even when it collides with another ceramic substrate in the rocking state during transfer and conveyance of ceramic substrates, its corner portions and notch portion are kept from collision and consequently, chipping of the corner portions or the notch portion is prevented.

According to this invention, there is provided a nearly rectangular ceramic substrate for use in packaging semiconductors, the end portion of at least one short side thereof comprising two outwardly projecting arcuate convex portions with a radius of curvature of Rs, an arcuate inwardly depressed concave portion with a radius of curvature of $R_B$ formed between said convex portions to define a nearly central part of said short side, corner portions with a radius of curvature of Rc each connecting the outside end portion of each arcuate convex portion to each long side of the substrate, and curvature connecting portions with a radius of curvature of Rt each connecting the inside end portion of each arcuate convex portion to each end portion of the arcuate concave portion, a pair of most projecting portions being located in the curvature connecting portions and spaced from each other by a distance corresponding to about one-half of the width of the ceramic substrate, the radii of curvatures of the individual portions having the following sizes Rs=20–110 mm,
$R_B$=60–350 mm,
Rc=0.1 mm or more, and
Rt=7–20 mm.

BRIEF DESCRIPTION OF THE ACCOMPANYING DRAWINGS

Figure 5:
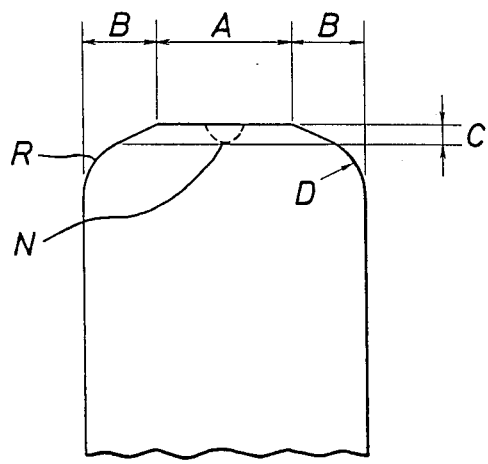
Figure 6:
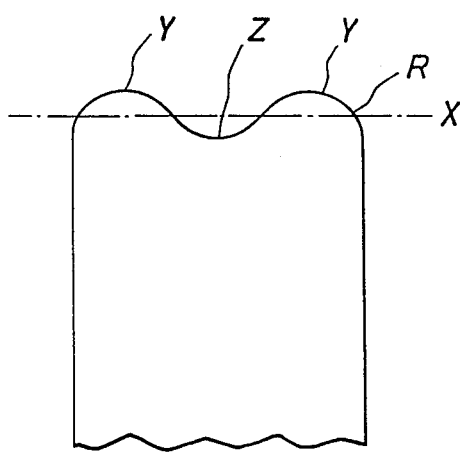

FIGS. 4-A, 4-B and 4-C are graphs showing the relation between the test cycle and the rate of occurrence of chipping; and FIGS. 5 and 6 are partial top plane views showing typical examples of the shapes of conventional ceramic substrates for semiconductor packages.

DETAILED DESCRIPTION OF THE PREFERRED EMBODIMENTS

The present invention will be described in detail with reference to the accompanying drawings.

Figure 1:
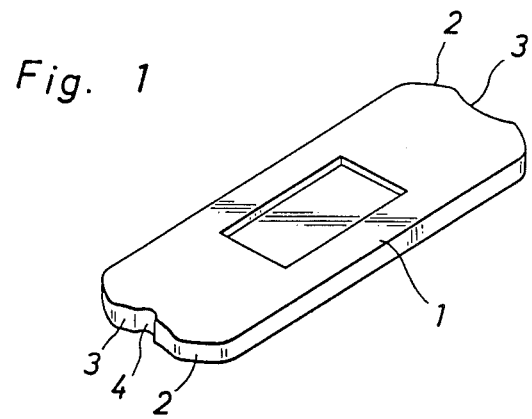
FIG. 1 is a perspective view showing one example of the ceramic substrate in accordance with this invention.
Figure 3:
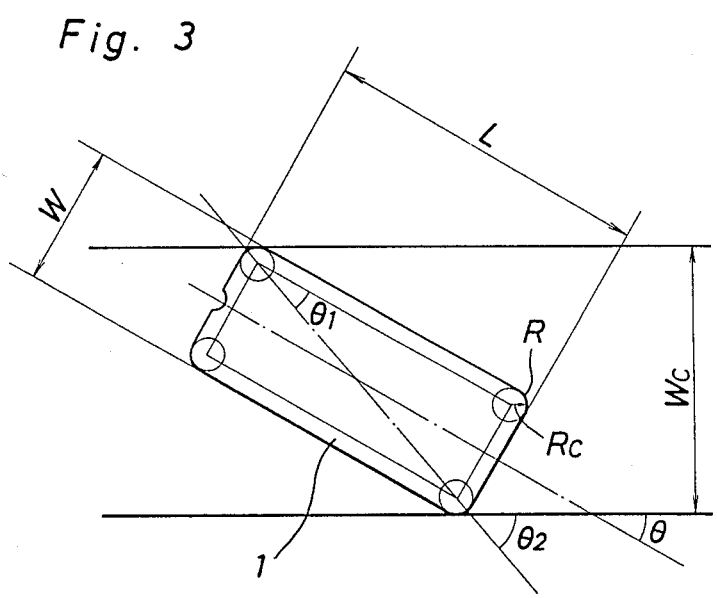
FIG. 3 is a view for explaining the degree of inclination of the ceramic substrate in a conveying container.

FIG. 1 is a top plan view showing one example of the ceramic substrate for semiconductor packaging in accordance with the present invention. A ceramic substrate 1 is obtained by press-forming a ceramic powder composed of alumina, etc. and sintering it to form an integral body.

Two outwardly projecting arcuate convex portions 2 are provided at the end portion of at least one short side of the substrate 1, and an inwardly depressed concave portion 3 is formed between the two convex portions 2 to define a nearly central part of the short side of the substrate 1. A notch 4 is formed nearly centrally in the concave portion 3.

In commercial ceramic substrates for semiconductor packaging now on the market, the substrate sizes are nearly rated. When viewed as a plane, a commercial ceramic substrate measures 20 to 55 mm along its long side and 6 to 15 mm along its short side.

In FIG. 1 showing the detailed shape and dimension of the short side of the ceramic substrate of this invention, the end portion of at least one short side comprises two outwardly projecting arcuate convex portions 2a, 2b with a radius of curvature of Rs, an inwardly depressed concave portion 3 with a radius of curvature of $R_B$ provided between the convex portions 2a and 2b to define a nearly central part of the short side, corner portions Ra, Rb with a radius of curvature of Rc each connecting the outside end portion of each arcuate convex portion 2a (2b) to each long side 5a (5b) of the substrate, and curvature connecting portions 6a, 6b with a radius of curvature of Rt each connecting the inside end portion of each arcuate convex portion 2a (2b) to each end portion of the arcuate concave portion 3.

In the present invention, a pair of most outwardly projecting portions 7a, 7b are positioned respectively in the curvature connecting portions 6a, 6b, and become sites at which ceramic substrates collide with each other with substantially the highest frequency. These portions 7a and 7b are spaced from each other by a distance corresponding to about one-half (W/2) of the width W of the ceramic substrate 1. Thus, they are located farthest from the notch 4 and the corner portions Ra, Rb so that collision at the above sites least affect the notch 4 or the corner portions Ra, Rb. Naturally, the distance between Ra (Rb) and the most outwardly projecting portion 7a (7b) is about W/4.

In the present invention, the radii of curvatures (Rs, $R_B$, Rc and Rt) of the individual portions are determined as follows:

The crossing part corner portion Ra (Rb) between the arcuate convex portion 2a (2b) and the long side 5a (5b) is formed in a curvated surface.

Desirably, in order to reduce the degree of stress concentration at the time of collision and prevent chipping at the corner portion Ra (Rb), the radius Rc of curvature of the corner portion Ra (Rb) is at least 0.1 mm, preferably about 0.2–1.5 mm.

The connecting portion 6a (6b) between the concave portion 3 and each arcuate convex portion 2a (2b) is formed in a curved surface. As stated above, ceramic substrates collide with each other substantially most frequently at the connecting portions 6a (6b). Extensive experiments have shown that these connecting portions are desirably provided in a radius of curvature Rt of 7 to 20 mm.

The radius of curvature (Rs) of the arcuate convex portion 2a (2b) is determined as 20 mm=Rs=110 mm. The angle $\theta$ of inclination of the ceramic substrate in the transferring equation (1).

$$\theta = \theta_2 - \theta_1 \quad (1)$$

$$= \sin^{-1}\left(\frac{W_c - 2R_c}{\sqrt{(L - 2R_c)^2 + (W - 2R_c)^2}}\right) -$$

$$\tan^{-1}\left(\frac{W - 2R_c}{L - 2R_c}\right)$$

where

L: the size of the long side
W: the size of the short side
Wc: the width of the transfer passage
Rc: the radius of curvature of the corner portion Ra (Rb)
$\theta$: the angle of inclination.

Figure 2:
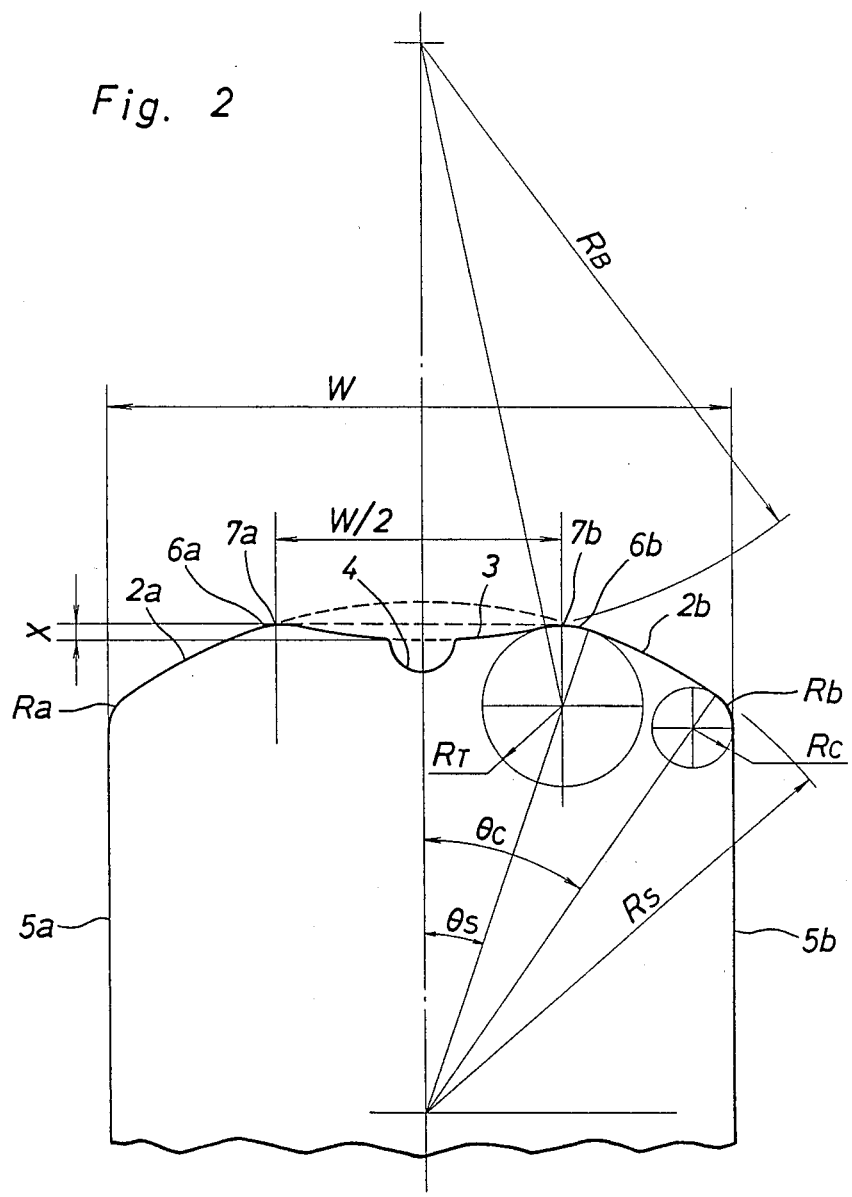
FIG. 2 is an enlarged top plane view for illustrating the dimensional relationship of the various portions of the ceramic substrate of this invention.

When semiconductor packages are stored in a transfer container now used on the market, the angle of inclination $\theta$ in the container is $0 < \theta < 6.0°$. Hence, when the radius of curvature, Rs, is selected so that the angle of inclination $\theta$ is given by the following equation $$\theta \leq \theta_s \quad (2)$$

or $$\theta_s < \theta < \theta_c \quad (3)$$

wherein $\theta_s$ is an angle formed between the line made by connecting the position where the convex portion 2a(2b) makes contact with the curvature connecting portion 6a(6b) to the center of the radius curvature Rs and the longitudinal line passing through the center of the radius of curvature Rs, and $\theta_c$ is an angle formed between the line made by connecting the position where the convex portion 2a(2b) makes contact with the corner portion Ra(Rb) to the center of the radius of curvature Rs and the radius of curvature Rs as shown in FIG. 2, collision of ceramic substrates with each other at the notch portion 4 or the corner portions Ra(Rb) can be avoided.

$\theta_s$ is given the following equation $$\theta_s = \sin^{-1}\left(\frac{W}{(R_S - R_T) \times 4}\right) \quad (4)$$

$\theta_c$ is given the following equation $$\theta_c = \sin^{-1}\left(\frac{\frac{W}{2} - R_C}{(R_S - R_C)}\right) \quad (5)$$

Therefore, from these equations (1) to (5), Rs may be prescribed so that it satisfies the following expression.

$$\theta = \sin^{-1}\left(\frac{W_C - 2R_C}{\sqrt{(L - 2R_C)^2 + (W - 2R_C)^2}}\right) - \quad (6)$$

$$\tan^{-1}\left(\frac{W - 2R_C}{L - 2R_C}\right) <$$

$$\sin^{-1}\left(\frac{\frac{W}{2} - R_C}{(R_S - R_C)}\right) = \theta_C$$

By calculation, Rs=20–110 mm.

In order to avoid direct application of stress to the notch portion 4 and to permit use of an automatic direction discriminating machine or an automatic position control machine set up on an existing production line, and also in view of the shapability of the mold, the depth X of the concave portion 3 is preset so as to be within 0.1 to 0.42 of the size W. Hence, the radius of curvature, $R_B$, of the concave portion 3 is given by the following equation $$Rb = \frac{W^2 + 16X^2}{32X} - Rt \qquad (7)$$

Thus, 60 mm $\leq R_B \leq$ 350 mm.

The present invention is not limited to the specific embodiment described above, and various changes and modifications are possible without departing from the spirit and scope of the invention described and claimed herein. For example, the convex portion and the concave portion may be provided only one of a short side having a notch and a short side not having a notch. It is also possible to provide free roundishness in the thickness direction of the convex and concave portions.

EXPERIMENTAL EXAMPLE

Ceramic substrates of alumina ceramics having conex portion of Rs and a concave portion of $R_B$ at the end portion of one short side were prepared, and occurrence of chipping which might lead to a reduction in the reliability of semiconductor devices was examined.

Four such ceramic substrates were stored in a hollow plastic container having a length of 60 cm, a width of 2.5 mm plus the widths of the substrates and a thickness of 0.5 mm plus the thicknesses of the substrates. The plastic container was rotated through 180° at a speed of 23 reciprocations per minute to induce collision between the ceramic substrates. Then, the appearances of the ceramic devices were examined. The limit of the dimension of a chipped part which is considered as a defect in appearance or as leading to a reduction in the reliability of a semiconductor device was provisionally determined to be 0.6 mm×0.6 mm×0.4 mm. The rate of occurrence of chipped parts having a dimension above this limit was examined. The results are shown in FIGS. 4-A, 4-B, and 4-C. In these drawings, the black columns refer to the ceramic substrates of the present invention, and the white columns, to conventional ceramic substrates. These substrates had the sizes shown in the following table.

TABLE

| Ceramic substrate | L | W | Rc | Rs | $R_B$ | Rt | A | FIG. |
|---|---|---|---|---|---|---|---|---|
| Invention (for 16 pins) | 19.3 | 7.0 | 0.75 | 30 | 96 | 9 | — | 4-A |
| Conventional (for 16 pins) | 19.3 | 7.0 | 0.75 | — | — | — | 3.5 | |
| Invention (for 20 pins) | 27.2 | 9.5 | 1.15 | 41 | 132 | 9 | — | 4-B |
| Conventional (for 20 pins) | 27.2 | 9.5 | 1.15 | — | — | — | 4.7 | |
| Invention (for 28 pins) | 36.8 | 14.7 | 1.15 | 63 | 200 | 18 | — | 4-C |
| Conventional (for 28 pins) | 36.8 | 14.7 | 1.15 | — | — | — | 7.3 | |

The experimental results demonstrate that since in the present invention, the arcuate convex portion having a radius of curvature of 20 to 110 mm are provided in the end portion of one short side of a ceramic substrate and an arcuate convex portion having a radius of curvature of 60 to 350 mm is formed between the convex portions to define a nearly central part of the short side, the rate of occurrence of chipping due to collision between ceramic substrates is drastically reduced as compared with conventional ceramic substrates. In particular, chipping at the notch portion or the corner portions hardly occurs, and this can markedly contribute to the increasing of reliability in semiconductor devices.

What is claimed is:

1. A nearly rectangular ceramic substrate for use in packaging semiconductors, the end portion of at least one short side of said substrate comprising two outwardly projecting arcuate convex portions with a radius of curvature of Rs, an arcuate inwardly depressed concave portion with a radius of curvature of $R_B$ formed between said convex portions to define a nearly central part of said short side, corner portions with a radius of curvature of Rc each connecting the outside end portion of each arcuate convex portion to each long side of the substrate, and curvature connecting portions with a radius of curvature of Rt each connecting the inside end portion of each arcuate convex portion to each end portion of the arcuate concave portion, a pair of most projecting portions being located in the curvature connecting portions and spaced from each other by a distance corresponding to about one-half of the width of the ceramic substrate, the radii of curvature of the individual portions having the following sizes Rs=20–110 mm,
$R_B$=60–350 mm,
Rc=0.1 mm or more, and
Rt=7–20 mm.

2. The ceramic substrate as claimed in claim 1, wherein the radius of curvature Rc is in the range of 0.2 to 1.5 mm.

3. A ceramic substrate for use in packaging semiconductors, said substrate being substantially rectangular having a first and second long side connected by two short sides, wherein the end portion of at least one short side comprises:

first and second outwardly projecting arcuate convex portion, each having a radius of curvature of RS;

an arcuate inwardly depressed concave portion having a radius of curvature of RB, said concave portion being disposed between said first and second convex portions;

first and second corner portions, each having a radius of curvature of Rc, wherein said first corner portion connects said first convex portion with the first long side and said second corner portion connects said second convex portion with the second long side; and first and second curvature connecting portions, each having a radius of curvature of Rt, wherein said first curvature connecting portion connects said first convex portion with said concave portion and said second curvature connecting portion connects said second convex portion with said concave portion;

wherein:
20 $\leq$ RS $\leq$ 110 mm;
60 $\leq$ RB $\leq$ 350 mm;
Rc $\geq$ 0.1 mm; and
7 $\leq$ Rt $\leq$ 20 mm.

4. A ceramic substrate as claimed in claim 3, wherein 0.2 $\leq$ Rc $\leq$ 1.5 mm.

* * * * *